(12) United States Patent
Cheng et al.

(10) Patent No.: US 7,427,545 B2
(45) Date of Patent: Sep. 23, 2008

(54) TRENCH MEMORY CELLS WITH BURIED ISOLATION COLLARS, AND METHODS OF FABRICATING SAME

(75) Inventors: Kangguo Cheng, Beacon, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/164,381

(22) Filed: Nov. 21, 2005

(65) Prior Publication Data
US 2007/0117307 A1 May 24, 2007

(51) Int. Cl.
*H01L 21/76* (2006.01)
*H01L 21/44* (2006.01)

(52) U.S. Cl. .................. 438/243; 438/246; 438/255; 438/386; 438/398; 257/E21.012; 257/E21.013; 257/E21.102; 257/E21.251; 257/E21.309

(58) Field of Classification Search .................. 438/238, 438/249, 243, 245, 386, 398
See application file for complete search history.

(56) References Cited

U.S. PATENT DOCUMENTS

| | | | | |
|---|---|---|---|---|
| 4,810,664 A | * | 3/1989 | Kamins et al. .................. 438/59 |
| 5,618,751 A | * | 4/1997 | Golden et al. ................ 438/392 |
| 5,759,907 A | * | 6/1998 | Assaderaghi et al. ......... 438/386 |
| 5,827,765 A | * | 10/1998 | Stengl et al. .................. 438/243 |
| 5,981,332 A | * | 11/1999 | Mandelman et al. ......... 438/246 |
| 6,008,104 A | | 12/1999 | Schrems |
| 6,100,131 A | * | 8/2000 | Alsmeier ...................... 438/243 |
| 6,107,135 A | * | 8/2000 | Kleinhenz et al. ............ 438/249 |
| 6,426,252 B1 | * | 7/2002 | Radens et al. ................ 438/243 |
| 6,576,558 B1 | * | 6/2003 | Lin et al. ...................... 438/700 |
| 6,599,798 B2 | | 7/2003 | Tews et al. |
| 6,861,312 B2 | * | 3/2005 | Birner et al. ................. 438/243 |
| 7,112,505 B2 | * | 9/2006 | Wu ............................. 438/386 |
| 2002/0137278 A1 | * | 9/2002 | Temmler et al. ............. 438/243 |

* cited by examiner

*Primary Examiner*—Michael S Lebentritt
(74) *Attorney, Agent, or Firm*—Scully, Scott, Murphy & Presser, P.C.; H. Daniel Schnurmann

(57) ABSTRACT

The present invention relates to semiconductor devices, preferably dynamic random access memory (DRAM) cells, each of which contains at least one trench capacitor with a buried isolation collar. The trench capacitor is located in a trench in a semiconductor substrate, and it comprises inner and outer electrodes and a dielectric layer. The buried isolation collar is recessed into a sidewall of the trench and has a substantially uniform thickness. Such a buried isolation collar is preferably formed by oxygen implantation before trench etching.

15 Claims, 6 Drawing Sheets

TRENCH MEMORY CELLS WITH BURIED ISOLATION COLLARS, AND METHODS OF FABRICATING SAME

FIELD OF THE INVENTION

The present invention generally relates to semiconductor devices and methods for fabricating same. More specifically, the present invention relates to dynamic random access memory (DRAM) cells that each comprises an access transistor and an adjacent storage trench capacitor that are electrically isolated from each other by a buried isolation collar that is recessed into the trench sidewall and has a substantially uniform thickness.

BACKGROUND OF THE INVENTION

Memory devices, such as DRAM cells, that each comprises an access transistor and an adjacent storage trench capacitor in series connection have demonstrated great advantages over conventional planar-stacked device structures. Trench capacitors have replaced the planar storage capacitors in order to meet the scaling demands for high performance dynamic random access memory (DRAM) cell production.

A trench capacitor is a three-dimensional device formed by etching a trench into a semiconductor substrate. After trench etching, a doped region is typically formed in the lower portion of the trench surrounding interior walls of the trench, which serves as an outer electrode or a buried plate electrode of the trench capacitor. A node dielectric is then formed over the outer or buried plate electrode in the trench, which serves as the insulating layer of the trench capacitor, followed by filling the trench, for example, with doped polycrystalline silicon (hereinafter poly-Si), which serves as the inner or upper electrode of the trench capacitor.

In order to isolate the outer electrode or the buried plate electrode of the trench capacitor from the source or drain region of the adjacent transistor, an insulating collar is typically deposited inside the trench on the trench sidewall. The insulating collar inside the trench narrows the trench opening and thus increases the series resistance of the trench capacitor. The increased series resistance impedes the speed of charge transfer to and from the storage trench capacitor and slows down the reading and writing operations.

As the devices are scaled below 90 nm, the thickness of the insulating collar is nevertheless maintained substantially the same, in order to ensure proper electrical isolation between the trench capacitor and the adjacent transistor. Consequentially, the trench resistance is becoming prohibitively high due to the relatively narrower trench opening.

In order to solve the above-described problems, a local oxidation of silicon (LOCOS) process has been used to form a buried LOCOS collar, which is recessed into the trench sidewalls and which therefore does not cause reduction in the trench opening diameter.

However, the buried LOCOS collar so formed has several inherent disadvantages. First, because it is formed by oxidizing the trench sidewall, and because the trench sidewall comprises various crystallographic orientations of different susceptibility to oxidation, the buried LOCOS collar does not have a uniform thickness. Instead, it is characterized by an irregular and non-uniform perimeter. Secondly, the LOCOS process requires multiple depositions of dielectric layers on the trench sidewall, which renders the process very complicated and almost cost-prohibitive. Further, the LOCOS requires removal of sacrificial polysilicon from the trench after formation of the buried LOCOS collar, which may have other deleterious impacts on the device structure, such as, for example, generation of defects and damage of the alignment marks.

There is therefore a continuing need for improved DRAM cells with buried collars that have substantially uniform thickness and are recessed into the trench sidewalls of the trench capacitors. Further, there is a need for a simple and reproducible method of forming such buried collars, with little or no deleterious impact on other parts of the DRAM cells.

SUMMARY OF THE INVENTION

The present invention in one aspect relates to a semiconductor device, comprising:

at least one trench capacitor located in a trench in a semiconductor substrate, the at least one trench capacitor comprising inner and outer electrodes with a dielectric layer therebetween; and at least one buried isolation collar that is recessed into a sidewall of the trench and has a substantially uniform thickness.

The phrase "a substantially uniform thickness" as used herein refers to a thickness variation of not more than ±10%. For example, for a buried isolation collar having an average thickness of about 30 nm, the thinnest region of the buried isolation collar is at least 27 nm thick, and the thickest region is not more than 33 nm thick.

Preferably, the buried isolation collar has a vertical surface that is substantially aligned with the trench sidewall. More preferably, the buried isolation collar is formed by converting an oxygen-implanted region in the semiconductor substrate.

The trench capacitor preferably, but not necessarily, comprises a buried plate electrode as its outer electrode and a polysilicon electrode as its inner electrode.

Further, the semiconductor device may comprise at least one field effect transistor (FET) adjacent to the trench capacitor. The FET comprises a source region and a drain region in the semiconductor substrate, with a channel region located therebetween and a gate electrode located over the channel region, wherein the source or drain region of said FET is electrically isolated from the outer electrode of said trench capacitor. The semiconductor device may also comprise at least one shallow trench isolation (STI) region for isolating said semiconductor devices from other devices located in the semiconductor substrate.

The present invention, in another aspect, relates to a method for forming a trench capacitor by forming a trench with a buried isolation collar in a semiconductor substrate, wherein the buried isolation collar has a substantially uniform thickness and is recessed into a sidewall of the trench, followed by forming a dielectric layer on the trench sidewall and an inner electrode in the trench.

Preferably, but not necessarily, the buried isolation collar is formed by:

forming an implant region in the semiconductor substrate;

removing a portion of the semiconductor substrate including a portion of the implant region, so as to form the trench in the semiconductor substrate, wherein the remaining portion of the implant region forms an implant-containing collar; and converting the implant-containing collar to the buried isolation collar.

Preferably, oxygen implantation is employed in the present invention for forming the implant region in the semiconductor substrate. More preferably, the implant-containing collar is converted by annealing in an environment containing nitrogen, argon, and/or oxygen at a temperature ranging from about 1200° C. to about 1380° C. for about 0.5 hour to about 10 hours.

Further, a buried plate is formed in the semiconductor substrate, either before or after forming the buried isolation collar, as an outer electrode of the trench capacitor.

A still further aspect of the present invention relates to a method for forming a semiconductor device comprising:

forming an implant region in a semiconductor substrate;

removing a portion of the semiconductor substrate including a portion of the implant region, so as to form a trench in the semiconductor substrate, wherein the remaining portion of the implant region forms an implant-containing collar;

converting the implant-containing collar into an isolation collar that has a substantially uniform thickness and is recessed into a sidewall of the trench;

forming a trench capacitor in the trench, wherein the trench capacitor comprises inner and outer electrodes with a dielectric layer therebetween; and forming a field effect transistor (FET) adjacent to the trench capacitor, the FET comprising a source region and a drain region located in the semiconductor substrate with a channel region therebetween, wherein a gate electrode is located over the channel region, wherein the isolation collar is arranged and constructed for electrically isolating the outer electrode of the trench capacitor from the source or drain region of the FET.

Note that in the present invention, the FET can be formed either before or after the trench capacitor.

Other aspects, features and advantages of the invention will be more fully apparent from the ensuing disclosure and appended claims.

DETAILED DESCRIPTION OF THE INVENTION

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
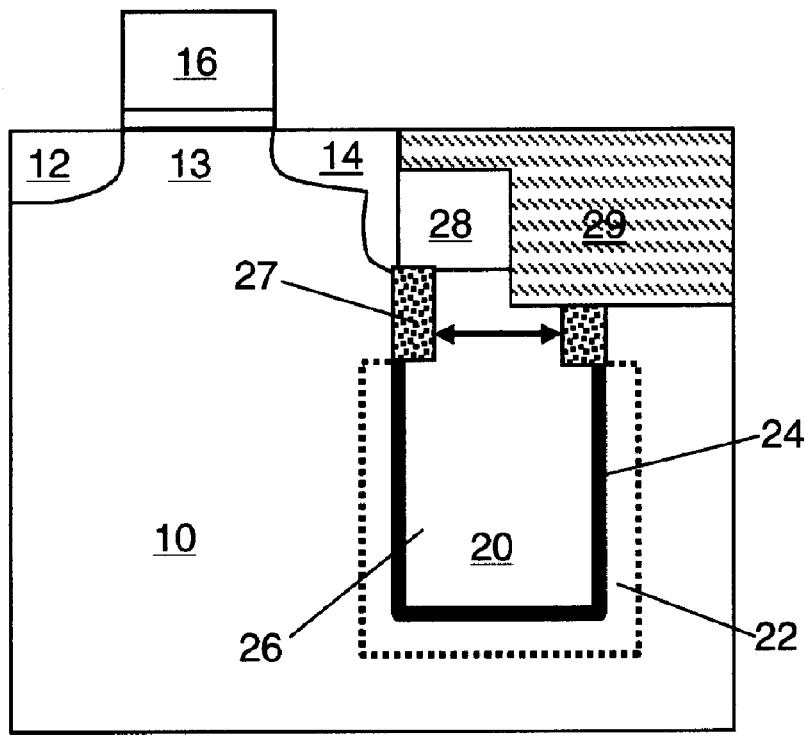
FIG. 1 shows a cross-sectional view of a conventional DRAM cell with a buried isolation collar that protrudes from the trench sidewall and narrows the trench opening.

FIG. 1 shows a conventional DRAM cell, which contains an FET adjacent to a trench capacitor. The FET comprises a source region 12 and a drain region 14 located in a semiconductor substrate 10, with a channel region 13 therebetween. A gate electrode 16 is located over the channel region 13. The trench capacitor is located in a trench 20 formed in the semiconductor substrate 10 and comprises an outer electrode or a buried plate electrode 22, a node dielectric layer 24, and an inner electrode 26. The inner electrode 26 of the trench capacitor and the drain region 14 of the FET are connected in series by polysilicon 28, while the outer electrode or buried plate electrode 22 of the trench capacitor is electrically isolated from the drain region 14 of the FET by a buried isolation collar 27 deposited over the trench sidewall. Further isolation may be provided by conventional shallow trench isolation 29.

Typically, the conventional DRAM cell as shown in FIG. 1 is formed by trench etching followed by formation of the outer electrode or buried plate electrode 22 and the node dielectric layer 24. The trench 20 is then filled with polysilicon to form the inner electrode 26 and then planarized and recessed to expose an upper portion of the trench sidewall, over which the buried isolation collar 27 is formed by chemical vapor deposition and reactive ion etching (RIE).

However, the buried isolation collar 27 formed by the chemical vapor deposition and RIE process protrudes from the trench sidewall and significantly narrows the trench opening, as shown by the arrowheads in FIG. 1. As discussed hereinabove, the narrowed trench opening increases the series resistance of the trench capacitor, which in turn leads to reduced charge transfer speed and slows down the reading and writing operations of the DRAM cell. Further, as the DRAM cell scales down to below 65 nm, the trench opening can be completely blocked by the buried isolation collar 27, due to the non-scalability of the collar thickness. Finally, the outer electrode or buried plate electrode 22, which is formed before deposition of the buried isolation collar 27, does not align well with the buried isolation collar 27, resulting in reduced storage capacitance of the DRAM cell or increased parasitic leakage current.

Figure 2:
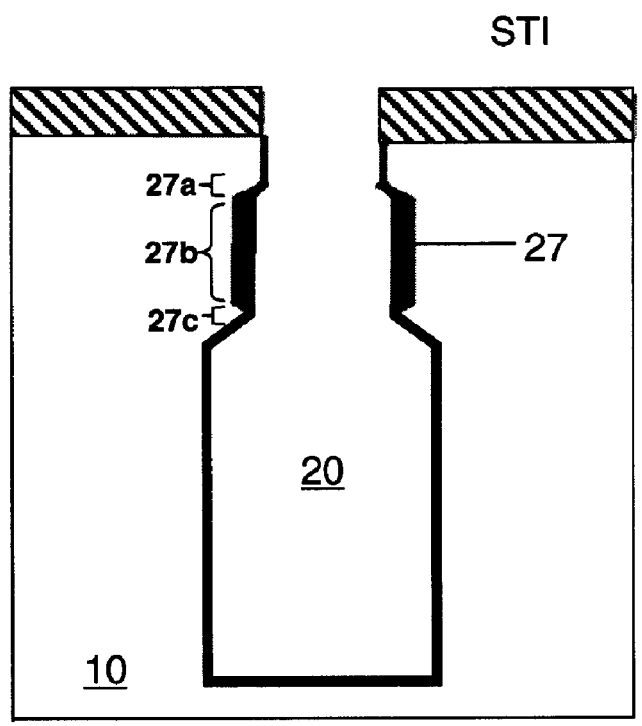
FIG. 2 shows a cross-sectional view of a buried isolation collar formed by a LOCOS process that has a non-uniform perimeter and significant thickness variation.

FIG. 2 shows another buried isolation collar 27 formed by a LOCOS process in trench 20. For more details about the LOCOS process used for forming the buried isolation collar 27, see U.S. Pat. No. 6,599,798 issued to Tews et al. Although the LOCOS buried isolation collar 27 is recessed into the trench sidewall and does not narrow the trench opening, the thickness of the LOCOS collar 27 varies significantly. For example, the LOCOS collar 27 is thicker in section 27$b$ but thinner in sections 27$a$ and 27$c$, while sections 27$a$ and 27$c$ are both characterized by a bird's beak shape with a thickness variation of more than 50%. Furthermore, because the trench sidewall comprises various crystallographic orientations, and different orientations have different oxidation rates, the buried LOCOS collar does not have a uniform thickness. Instead, it is characterized by an irregular and non-uniform perimeter.

The non-uniform thickness of the LOCOS collar 27 leads to insufficient isolation between the transistor and the capacitor and thus increase of parasitic leakage current well known in the art.

The present invention provides an improved DRAM cell structure, which contains a buried isolation collar that is recessed into the trench sidewall and also has a substantially uniform thickness. Such a recessed buried isolation collar preferably has a vertical surface that is substantially aligned (i.e., with less than ±10% offset or misalignment) with the trench sidewall.

The recessed buried isolation collar of the present invention provides sufficient isolation between the trench capacitor and the FET without narrowing the trench opening, and enables the storage trench capacitor of the DRAM cell to be scaled down to below 65 nm. The wide trench opening facilitates trench filling and reduces the series capacitance of the trench capacitor. Moreover, the recessed buried isolation collar of the present invention is characterized by a substantially uniform thickness, which significantly improves the isolation between the transistor and the capacitor and thus suppresses the undesired parasitic leakage current.

The present invention also provides a simple and reproducible method for forming the above-described improved DRAM cell structure, which enables self-alignment of the outer electrode or buried plate electrode of the trench capacitor with the buried isolation collar and results in increased storage capacitance.

Figure 3:
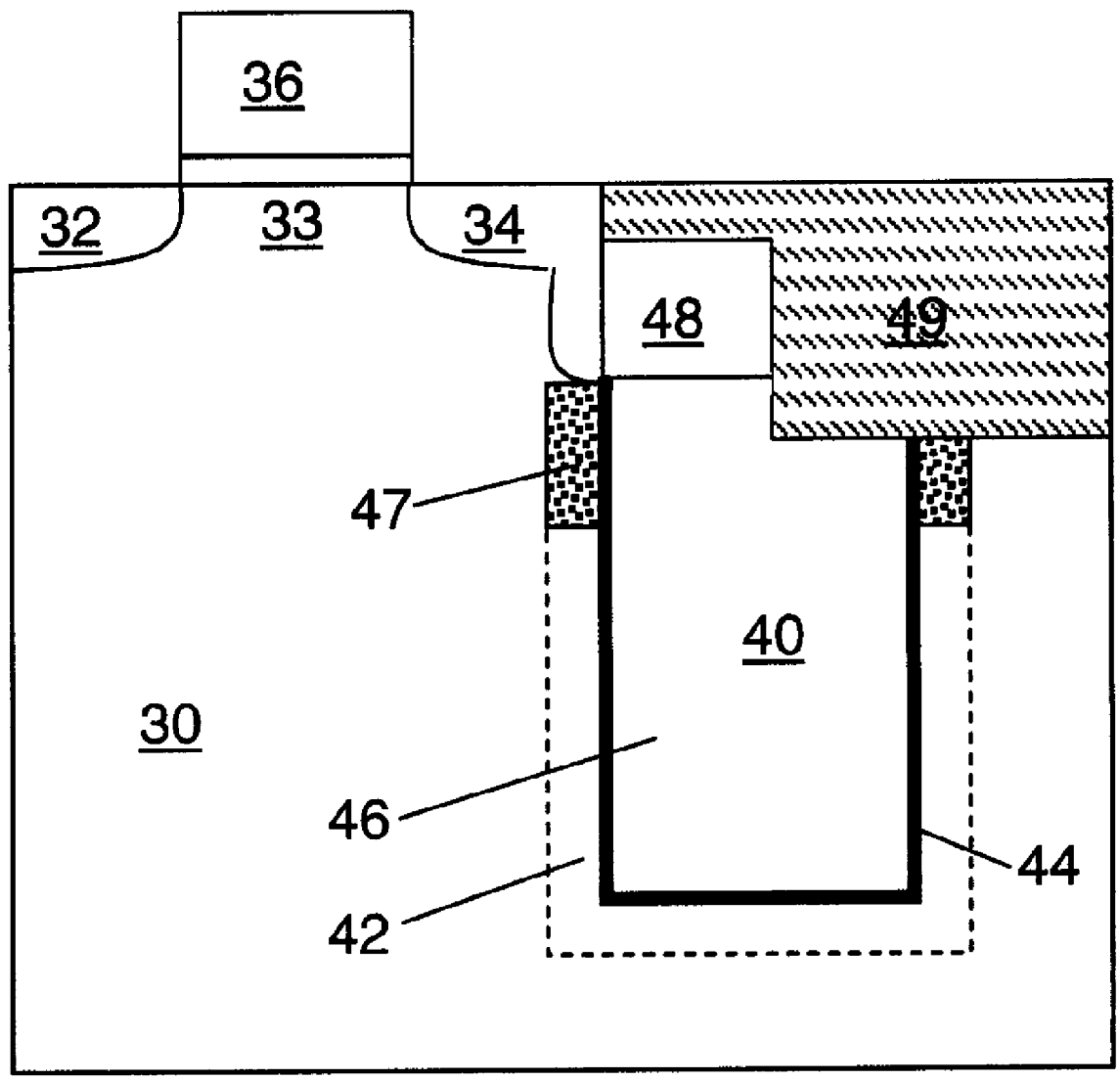
FIG. 3 shows a cross-sectional view of an exemplary DRAM cell with a buried isolation collar that has a substantially uniform thickness and is recessed into the trench sidewall, according to one embodiment of the present invention.

An exemplary DRAM device of the present invention is illustrated in FIG. 3, which is defined and isolated from other device structures by one or more shallow trench isolation regions 49. The DRAM device preferably contains at least one FET adjacent to at least one trench capacitor. The at least one FET comprises a source region 32 and a drain region 34 located in a semiconductor substrate 30, with a channel region 33 therebetween. A gate electrode 36 is located over the channel region 33. The trench capacitor is located in a trench 40 formed in the semiconductor substrate 30 and comprises an outer electrode or a buried plate electrode 42, a node dielectric layer 44, and an inner electrode 46. The inner electrode 46 of the trench capacitor and the drain region 34 of the FET are connected in series by polysilicon 48, while the outer electrode or buried plate electrode 42 of the trench capacitor is electrically isolated from the drain region 34 of the FET by a buried isolation collar 47 that is recessed into the trench sidewall.

Specifically, the buried isolation collar 47 has a vertical surface that is substantially aligned with the trench sidewall, and it is further characterized by a substantially uniform thickness, with little ($\leq$±10%) or no thickness variation.

Note that in FIG. 3, which is not drawn to scale, only one FET and one trench capacitor are shown on the semiconductor substrate 30. Although illustration is made to such an embodiment, the present invention is not limited to any specific number of FETs or other types of semiconductor devices, such as bipolar junction transistors (BJT) and trench capacitors. Further, the DRAM devices of the present invention may also contain other logic circuitry components, such as resistors, diodes, planar capacitors, varactors, etc.

The exemplary processing steps for forming the DRAM cell of FIG. 3 will now be described in greater detail by referring to the accompanying FIGS. 4A-4G.

Figure 4A:
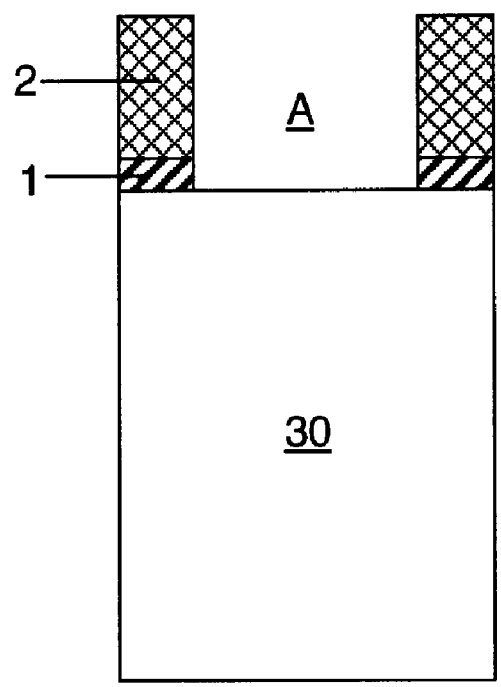
FIGS. 4A-4F are cross-sectional views that illustrate exemplary processing steps for forming the DRAM cell of FIG. 3.

Reference is first made to FIG. 4A, which shows a semiconductor substrate 30 with a pad layer 1 and a hard mask layer 2 formed thereupon. The pad layer 1 and the hard mask layer 2 are patterned to provide an opening A that exposes an upper surface of the semiconductor substrate 30.

The semiconductor substrate 30 may comprise any semiconductor material including, but not limited to: Si, SiC, SiGe, SiGeC, Ge alloys, GaAs, InAs, InP, other III-V or II-VI compound semiconductors, or organic semiconductor structures. In some embodiments of the present invention, it is preferred that the semiconductor substrate 30 be composed of a Si-containing semiconductor material, i.e., a semiconductor material that includes silicon. Further, the semiconductor substrate 30 may be doped, undoped, or contain both doped and undoped regions therein (not shown). Semiconductor substrate 30 may comprise a bulk semiconductor structure, a layered semiconductor structure such as Si/SiGe, or a semiconductor-on-insulator structure.

The pad layer 1 may comprise a single pad oxide layer or a combination of pad oxide and pad nitride layers. The hard mask layer 2 may be an oxide layer. The processes that can be used for forming and patterning the pad layer 1 and the hard mask layer 2 are well known in the art and are therefore not described in detail here. Preferably, the pad layer 1 and the hard mask layer 2 are patterned by conventional processes such as lithography or RIE.

Figure 4B:
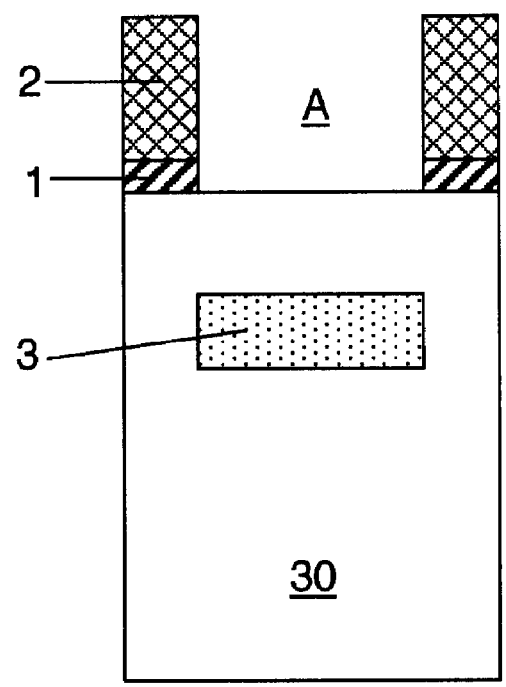

Next, oxygen is implanted into the semiconductor substrate 30 to form an oxygen implant region 3 therein, as shown in FIG. 4B. The oxygen implantation process that can be used for forming the oxygen implant region 3 is similar to the separation by implanted oxygen (SIMOX) process described by Nakashima et al., Analysis of Buried Oxide Layer Formation and Mechanism of Threading Dislocation Generation in the Substoichiometric Oxygen Dose Region, JOURNAL OF MATERIALS RESEARCH, Vol. 8, No. 3, pp. 523-534 (March 1993). The oxygen implant region 3 formed by such an oxygen implantation process is typically characterized by a uniform perimeter, as shown in FIG. 4B.

Preferably, the oxygen dosage concentration for the implantation ranges from about $1 \times 10^{17}/cm^2$ to about $2 \times 10^{18}/cm^2$, more preferably from about $3 \times 10^{17}/cm^2$ to about $1 \times 10^{18}/cm^2$, and most preferably about $3 \sim 4 \times 10^{17}/cm^2$. The depth and width of the oxygen implant region 3 are determined by the implantation energy. For example, an oxygen implantation process at an energy level of about 180 KeV forms an oxygen implant region 3 having a center that is located at a depth of about 400 nm. A chain implantation process with multiple implantation steps carried out at different energy levels can be employed to adjust the depth and width of the oxygen implant region 3.

Figure 4C:
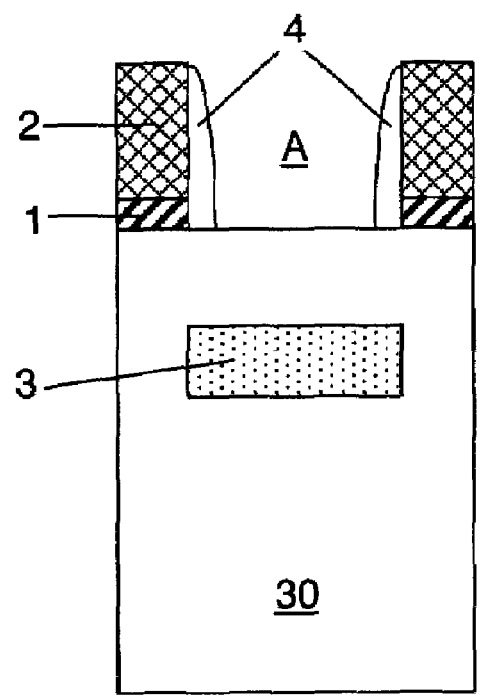

After formation of the oxygen implant region 3, an optional sidewall spacer 4 is formed on the sidewalls of the pad layer 1 and the hard mask layer 2 in the opening A, as shown in FIG. 4C. The sidewall spacer 4 preferably comprises silicon nitride or silicon oxynitride, and it can be readily formed by conventional processing steps that include deposition and anisotropic etching, such as RIE. The sidewall spacer 4 is only necessary when the width of the oxygen implant region 3 is smaller than that of the opening A. However, in the event that the width of the oxygen implant region 3 is adjusted so that the buried isolation region 3 extends laterally to underneath the patterned pad layer 1 and hard mask layer 2, the sidewall spacer 4 is then not necessary.

Figure 4D:
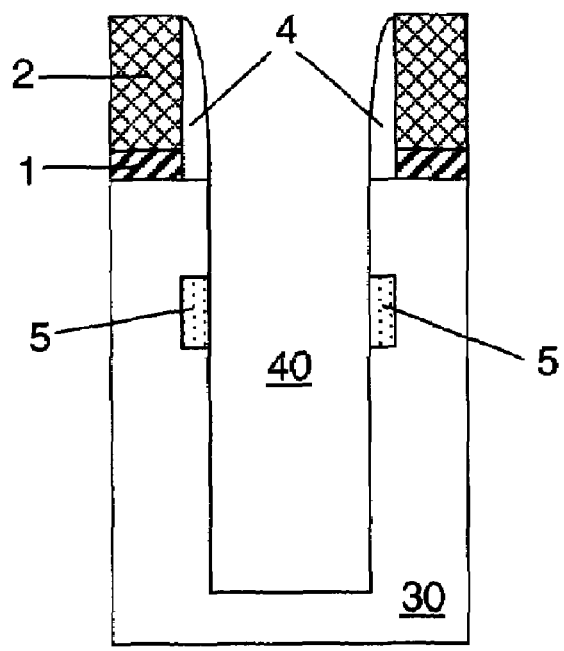

Subsequently, a portion of the semiconductor substrate 30, including a portion of the oxygen implant region 3, is selectively removed to form a deep trench 40 in the semiconductor substrate 30, as shown in FIG. 4D. The remaining portion of the oxygen implant region 3 forms an oxygen-containing collar 5, which is recessed into the trench sidewall and has a vertical surface that is substantially aligned with the trench sidewall. More importantly, the oxygen-containing collar 5 is formed from the oxygen implant region 3 of a substantially uniform perimeter, so it has a substantially uniform thickness.

A plasma-based reactive ion etching (RIE) process, or any other well-known dry etching process, can be carried out to form the deep trench 40 in the semiconductor substrate 30, by using the patterned hard mask layer 2 and the optional sidewall spacer 4 as masks. Preferably, the deep trench 40 has a depth of about 2 μm to about 10 μm, and more preferably of from 4 μm to about 8 μm.

Figure 4E:
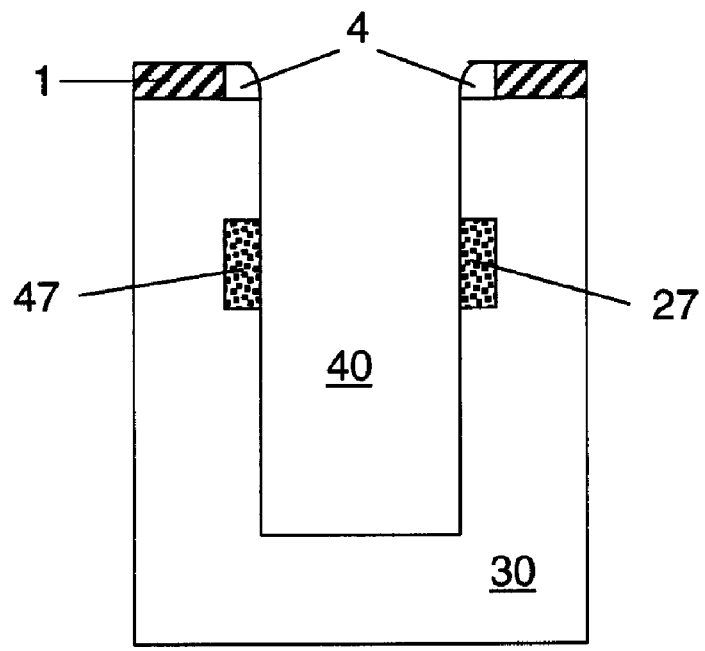

The patterned hard mask layer 2 and an upper portion of the optional sidewall spacer 4 are removed by stripping after formation of the deep trench 40, as shown in FIG. 4E. Alternatively, the hard mask layer 2 and the upper portion of the optional sidewall spacer 4 can be removed in other subsequent processing steps.

Next, a high-temperature annealing step is carried out to convert the oxygen-containing collar 5 to a buried isolation collar 47 that contains silicon oxide. Preferably, the annealing is carried out at a temperature from about 1200° C. to about 1380° C. for about 0.5 hour to 10 hours. A nitrogen- and/or argon-containing environment is typically provided for the annealing. Oxygen can be added during the annealing. In the presence of oxygen, a thin oxide layer will form on the trench sidewall, which needs to be removed after the annealing.

After formation of the buried isolation collar 47, a trench capacitor is formed in the trench 40 by conventional processing steps. For example, the trench capacitor may contain a buried plate electrode 42, a node dielectric layer 44, and an inner electrode 46. The buried plate electrode 42 can be readily formed by gas phase doping, liquid phase doping, solid phase doping, plasma doping, ion implantation, plasma immersion ion implantation, cluster ion implantation, infusion doping, and any suitable combination of these techniques. The buried isolation collar 47 functions as a mask to enable self-alignment of the buried plate electrode 42 with the buried isolation collar 47. Conventionally, the buried isolation collar is aligned to a pre-existing buried plate electrode, which typically results in mis-alignment or offset between the buried isolation collar and the buried plate electrode. Therefore, the self-aligning characteristic of the buried plate electrode of the present invention constitutes another important advancement over conventional structures.

The node dielectric layer 44 can be formed by any suitable dielectric deposition techniques, including, but not limited to: ALD, CVD, and PVD, and it may comprise any dielectric material, including, but not limited to: silicon oxide, silicon nitride, silicon oxynitride, aluminum oxide, hafnium oxide, barium strontium oxide, and any suitable combination of these materials. Preferably, the node dielectric layer 44 comprises a high-k (i.e., k>4.0) dielectric material, such as silicon nitride, silicon oxynitride, aluminum oxide ($Al_2O_3$) and hafnium oxide ($HfO_2$), which allows use of relatively shallow trenches for achieving a required capacitance for the trench capacitor, e.g., about 20 fF, thereby reducing the required device processing time.

The inner electrode 46 preferably, but not necessarily, comprises polysilicon, and it can be readily formed by the conventional trench fill techniques. Other conductive materials, such as metals and/or conductive metallic compounds, are also contemplated herein.

After formation of the trench capacitor, conventional complementary metal-oxide-semiconductor (CMOS) processing steps can be used for forming an adjacent transistor to complete the DRAM device structure shown by FIG. 3. The transistor can be formed in an upper surface of the semiconductor substrate 30, as shown in FIG. 3. Alternatively, it can be formed vertically on the sidewall of the trench 40 above the buried isolation collar 47 (not shown). One or more shallow trench isolation regions 49 are eventually formed into the semiconductor substrate 30 to provide isolation between the DRAM device and any other device structures located on the semiconductor substrate 30. The STI regions can be readily formed utilizing a conventional trench isolation process well known to those skilled in the art.

Figure 4F:
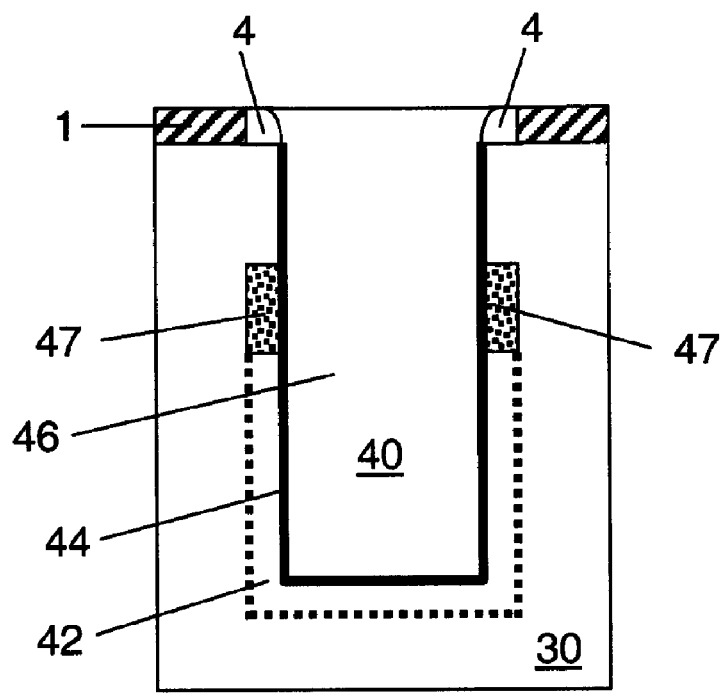
Figure 4G:
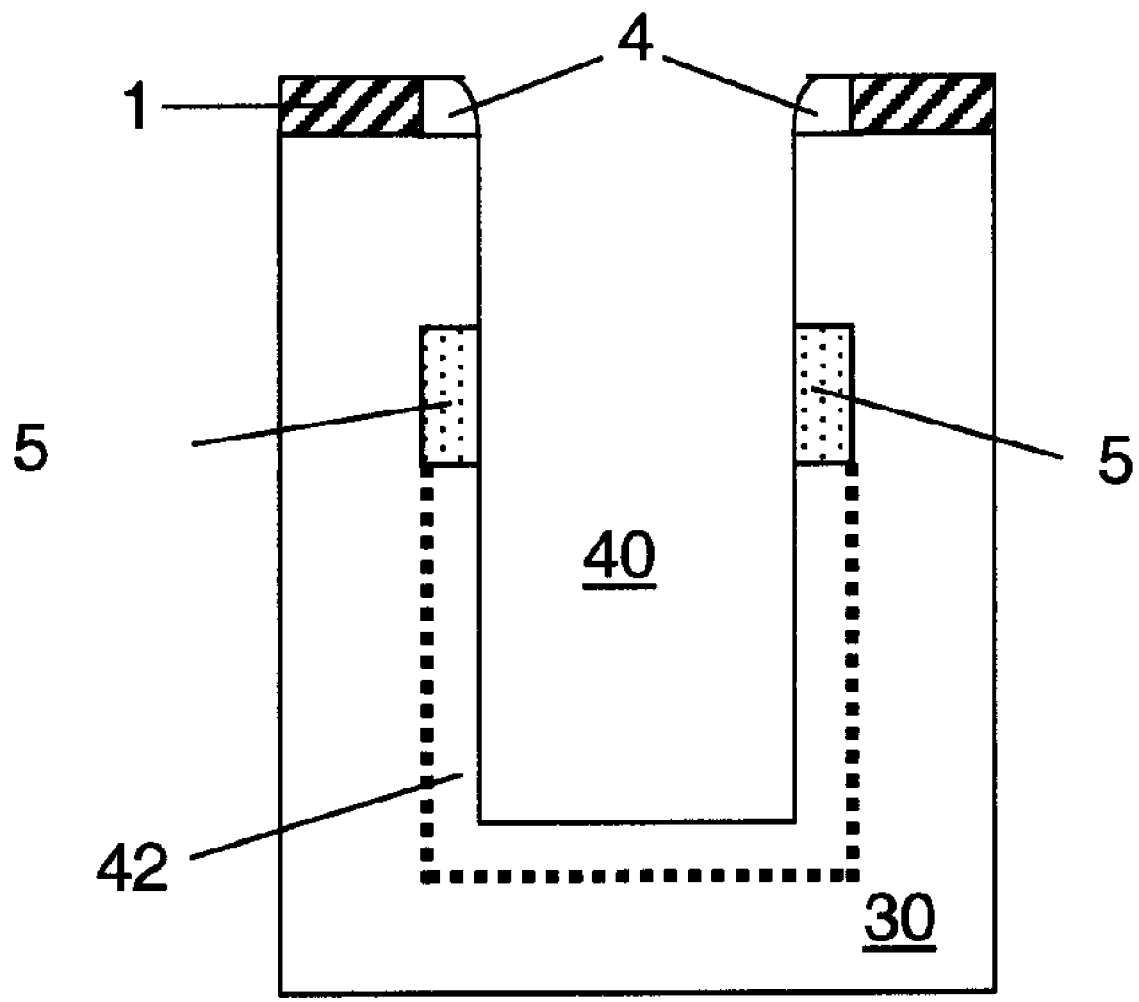
FIG. 4G shows an alternative embodiment for forming the DRAM cell of FIG. 3.

FIG. 4G shows an alternative process embodiment, in which the buried plate is formed before converting the oxygen-implanted collar into the buried isolation collar. Specifically, after forming the deep trench 40 in the substrate 30 containing the oxygen-implanted collar 5 as shown in FIG. 4D, the buried plate 42 is formed wherein the top portion of the buried plate is overlapped with the buried oxygen-implanted collar 5, as shown in FIG. 4G. Next, the high-temperature annealing step is carried out to convert the oxygen-implanted collar 5 to the buried isolation collar 47, resulting in the same structure as shown in FIG. 4F.

The structure and process of the present invention are particularly suitable for use in the 65 nm node and below, because the recessed buried isolation collar and the reduced series resistance of the trench capacitor are suitable for further scaling of the trench size and allows formation of smaller high-performance DRAM cells. Exemplary applications of such high-performance DRAM devices include, but are not limited to, embedded memory, system-on-chip (SoC) and application-specific integrated circuits (ASIC).

While FIGS. 4A-4G illustratively demonstrates several exemplary processing steps that can be used to form an DRAM cell, according to a specific embodiment of the present invention, it is clear that a person ordinarily skilled in the art can readily modify such process steps as well as the device structure so formed for adaptation to specific application requirements, consistent with the above descriptions. For example, while the trench capacitors as illustrated hereinabove are designed for use as memory capacitors in the DRAM technology, it is clear that a person ordinarily skilled in the art can readily modify the trench capacitors of the present invention for use in other applications where capacitors are needed, such as decoupling capacitors, filters, etc. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A method for forming a trench capacitor, comprising:
   forming a hard mask layer on a semiconductor substrate and patterning an opening within said hard mask layer;
   implanting oxygen into said semiconductor substrate through said opening in said hard mask layer, wherein an oxygen implant region is formed in said semiconductor substrate;
   forming a trench in a semiconductor substrate by etching said semiconductor substrate within said opening, wherein a remaining portion of said oxygen implant region constitutes an oxygen-containing collar;
   converting said oxygen-containing collar into a buried isolation collar that laterally surrounds a portion of said trench, wherein said buried isolation collar has a substantially uniform thickness, and is recessed into a trench sidewall;
   forming a dielectric layer on said trench sidewall and an inner electrode in the trench.

2. The method of claim 1, wherein said oxygen-containing collar is converted into said buried isolation collar by annealing in an environment containing nitrogen, argon, and/or oxygen at a temperature ranging from about 1200° C. to about 1380° C. for about 0.5 hour to about 10 hours.

3. The method of claim 1, further comprising forming a buried plate as an outer electrode of said trench capacitor.

4. The method of claim 3, wherein said buried plate is formed either before or after forming the buried isolation collar.

5. A method for forming a semiconductor device, comprising:

forming a hard mask layer on a semiconductor substrate and patterning an opening within said hard mask layer;

implanting oxygen into said semiconductor substrate through said opening in said hard mask layer, wherein an oxygen implant region is formed in said semiconductor substrate;

forming a trench in a semiconductor substrate by etching said semiconductor substrate within said opening, wherein a remaining portion of said oxygen implant region constitutes an oxygen-containing collar;

converting said oxygen-containing collar into a buried isolation collar that laterally surrounds a portion of said trench, wherein said buried isolation collar has a substantially uniform thickness, and is recessed into a trench sidewall; and forming a field effect transistor (FET) adjacent to the trench capacitor, said FET comprising a source region and a drain region located in the semiconductor substrate with a channel region therebetween, wherein a gate electrode is located over the channel region, wherein the isolation collar is arranged and constructed for electrically isolating the outer electrode of the trench capacitor from the source or drain region of the FET.

6. The method of claim 5, wherein the FET is formed either before or after the trench capacitor.

7. The method of claim 5, wherein the buried isolation collar has a vertical surface that is substantially aligned with the trench sidewall.

8. The method of claim 5, wherein the outer electrode of the trench capacitor is a buried plate electrode.

9. The method of claim 5, wherein the inner electrode of the trench capacitor comprises polysilicon.

10. The method of claim 1, further comprising formation of at least one shallow trench isolation (STI) region in the semiconductor substrate for isolating the semiconductor device so formed from other devices located in the semiconductor substrate.

11. The method of claim 1, wherein a top surface of said semiconductor substrate is exposed within said opening within said hard mask layer.

12. The method of claim 1, further comprising removing a portion of said semiconductor substrate including a portion of said oxygen implant region during formation of said trench.

13. The method of claim 1, wherein said buried isolation collar contains silicon oxide.

14. The method of claim 1, further comprising forming a tin oxide layer on said trench sidewall during conversion of said oxygen-containing collar into said buried isolation collar.

15. The method of claim 14, further comprising removing said thin oxide layer.

* * * * *